(12) United States Patent
Tanaka et al.

(10) Patent No.: US 7,629,232 B2
(45) Date of Patent: Dec. 8, 2009

(54) SEMICONDUCTOR STORAGE DEVICE AND MANUFACTURING METHOD THEREOF

(75) Inventors: Masayuki Tanaka, Yokohama (JP); Hirokazu Ishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/193,531

(22) Filed: Aug. 18, 2008

(65) Prior Publication Data

US 2008/0311734 A1 Dec. 18, 2008

Related U.S. Application Data

(62) Division of application No. 11/344,074, filed on Feb. 1, 2006.

(30) Foreign Application Priority Data

Sep. 30, 2005 (JP) ............................. 2005-285791

(51) Int. Cl.
*H01L 21/322* (2006.01)

(52) U.S. Cl. .................. 438/476; 438/287; 438/591; 438/593; 257/E21.422; 257/E21.497; 257/E21.639

(58) Field of Classification Search ................ 438/260, 438/477; 257/E21.179, E21.191, E21.369, 257/E21.466, E21.497, E21.613, E21.662
See application file for complete search history.

(56) References Cited

U.S. PATENT DOCUMENTS

| | | | |
|---|---|---|---|
| 6,410,412 B1 * | 6/2002 | Taira et al. | 438/594 |
| 6,617,639 B1 | 9/2003 | Wang et al. | |
| 6,818,944 B2 | 11/2004 | Lee | |
| 7,294,878 B2 | 11/2007 | Tanaka et al. | |
| 2003/0151084 A1 | 8/2003 | Lee et al. | |
| 2004/0104422 A1 | 6/2004 | Arai et al. | |
| 2004/0164329 A1 | 8/2004 | Hirano et al. | |
| 2005/0002231 A1 | 1/2005 | Ozawa et al. | |
| 2005/0110101 A1 | 5/2005 | Kaneko et al. | |
| 2005/0202659 A1 | 9/2005 | Li et al. | |
| 2005/0212036 A1 | 9/2005 | Tanaka et al. | |

(Continued)

FOREIGN PATENT DOCUMENTS

JP 2001-185548 7/2001

OTHER PUBLICATIONS

U.S. Appl. No. 12/234,190, filed Sep. 19, 2008, Nagano, et al.

*Primary Examiner*—Savitri Mulpuri
*Assistant Examiner*—Cheung Lee
(74) *Attorney, Agent, or Firm*—Oblon, Spivak, McClelland, Maier & Neustadt, L.L.P.

(57) ABSTRACT

A non-volatile semiconductor storage device having a high-dielectric-constant insulator and a manufacturing method thereof suitable for miniaturization are disclosed. According to one aspect of the present invention, it is provided a semiconductor storage device comprising a semiconductor substrate, a plurality of first conductor layers formed on the semiconductor substrate through a first insulator, an isolation formed between the plurality of first conductor layers, a silicon oxide film formed on the first conductor layer, a high-dielectric-constant insulator formed on the silicon oxide film and the isolation and being diffused silicon and oxygen at least in a surface thereof contacting with the silicon oxide film, and a second conductor film formed above the high-dielectric-constant insulator.

14 Claims, 5 Drawing Sheets

U.S. PATENT DOCUMENTS

| | | |
|---|---|---|
| 2005/0275012 A1 | 12/2005 | Nara et al. |
| 2006/0131672 A1 | 6/2006 | Wang et al. |
| 2008/0176389 A1 | 7/2008 | Tanaka et al. |
| 2009/0085175 A1* | 4/2009 | Clark et al. ................. 257/637 |

* cited by examiner

SEMICONDUCTOR STORAGE DEVICE AND MANUFACTURING METHOD THEREOF

CROSS-REFERENCE TO RELATED APPLICATIONS

This application is a divisional of U.S. application Ser. No. 11/344,074, filed Feb. 1, 2006, and is based upon and claims the benefit of priority from prior Japanese Patent Application No. 2005-285791, filed on Sep. 30, 2005, the entire contents of which are incorporated herein by reference.

BACKGROUND OF THE INVENTION

1. Field of the Invention

The present invention relates to a semiconductor storage device and a manufacturing method thereof, and more particularly to a semiconductor storage device having a high-dielectric-constant insulator and a manufacturing method thereof.

2. Description of the Related Art

With the miniaturization of a semiconductor storage device, not only a memory cell storing information has been miniaturized but also a space between adjacent memory cells. In a conventional storage device, especially in a non-volatile semiconductor storage device, an inter-electrode capacitance between a floating gate electrode and a control gate electrode is increased by forming an inter-electrode insulator not only on an upper surface of the floating gate electrode but also on a part of a side surface thereof. The floating gate electrode serves as an electric charge storage layer and the control gate electrode serves as a word line. When a space between the memory cells is reduced, there occurs a problem, e.g., an increase in a wiring line delay occurs due to capacitance coupling caused by a parasitic capacitance between side surfaces of adjacent memory cells.

As one means for solving this capacitance coupling problem, there is a structure which uses a flat memory cell having a flat inter-electrode insulator. Such a flat memory cell has advantages, such as a manufacturing process can be simplified and stabilized. On the other hand, as the inter-electrode insulator in the flat memory cell, it is necessary to use a high-dielectric-constant insulator having a relative dielectric constant higher than that of an ONO film (a three-layered film consisted of a silicon oxide ($SiO_2$) film, a silicon nitride ($Si_3N_4$) film and a silicon oxide ($SiO_2$) film), which is a conventional inter-electrode insulator.

Since the high-dielectric-constant insulator generally contains many grown in defects therein, it inherently has a problem that desired electrical characteristics can not be obtained in the grown high-dielectric-constant insulator. As example of the defects, for example, there are oxygen defects and the like due to an insufficient reaction or insufficient supply of oxygen when forming the high-dielectric-constant insulator and/or oxygen defects in the vicinity of a surface caused by processing in reducing atmosphere when depositing, e.g., an electrode material on the high-dielectric-constant insulator. Such defects act as electron trap sites, and hence a leak current of the high-dielectric-constant insulator is increased.

Jpn. Pat. Appln. KOKAI Publication No. 2001-185548 discloses a technology which compensates an oxygen defect in a tantalum oxide ($Ta_2O_5$) film which is one of high-dielectric-constant insulators. According to this technology, after forming the $Ta_2O_5$ film directly on a silicon substrate, an ultraviolet light is first applied to the $Ta_2O_5$ film in an atmosphere including nitrogen (N) and oxygen (O), e.g., nitric oxide (NO), heated to approximately 700° C. As a result, nitrogen radical and oxygen radical are generated. The nitrogen radical diffuses through the $Ta_2O_5$ film to reach the silicon substrate. Diffused nitrogen radical is coupled with a dangling bond of silicon at the silicon substrate surface to form SiON, whereby the silicon surface is stabilized. Then, a rapid heat treatment is carried out in an oxidizing atmosphere at approximately 800° C. to recover oxygen defects in the $Ta_2O_5$ film. Although oxygen diffuses to the silicon substrate surface during the heat treatment, since the silicon surface is stabilized by SiON, and hence silicon is not oxidized. Since the heat treatment must be carried in two stages and an ultraviolet light must be applied while heating, this technology has a problem, e.g., an increase in manufacturing steps, a manufacturing apparatus being complicated, and others.

BRIEF SUMMARY OF THE INVENTION

According to one aspect of the present invention, it is provided a semiconductor storage device comprising: a semiconductor substrate; a plurality of first conductor layers formed on the semiconductor substrate through a first insulator; an isolation formed between the plurality of first conductor layers; a silicon oxide film formed on the first conductor layer; a high-dielectric-constant insulator formed on the silicon oxide film and the isolation and being diffused silicon and oxygen at least in a surface thereof contacting with the silicon oxide film; and a second conductor film formed above the high-dielectric-constant insulator.

According to another aspect of the present invention, it is provided a manufacturing method of a semiconductor storage device, comprising: depositing a first conductor layer on a semiconductor substrate through a first insulator; patterning the first conductor layer, the first insulator and the semiconductor substrate to form an isolation extending in a first direction; forming a silicon oxide film on the first conductor layer; depositing a high-dielectric-constant insulator on the silicon oxide film; depositing a second conductor film on the high-dielectric-constant insulator; recovering defects in the high-dielectric-constant insulator by decomposing the silicon oxide film and supplying oxygen and/or silicon to the insulator by a heat treatment; and patterning the second conductor layer and the high-dielectric-constant insulator to be extended in a second direction orthogonal to the first direction to form a memory cell.

DETAILED DESCRIPTION OF THE INVENTION

Figure 1A:
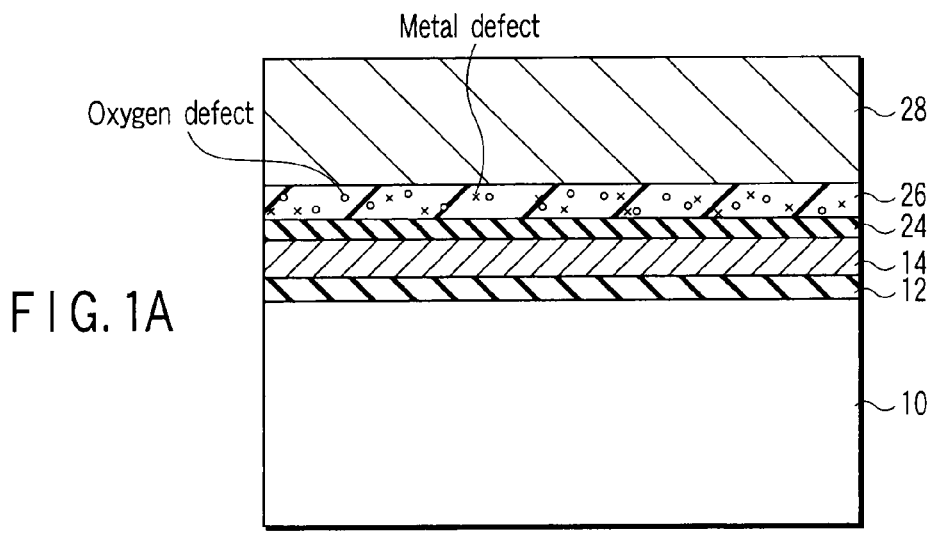
FIGS. 1A to 1C are cross-sectional views of a semiconductor storage device, illustrating a principle according to an embodiment of the present invention.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention relates to a non-volatile semiconductor storage device having a high-dielectric-constant insulator, and a manufacturing method thereof, which are suitable for miniaturization.

One embodiment according to the present invention provides a semiconductor storage device having a high-dielectric-constant insulator and a manufacturing method thereof. In the semiconductor storage device, defects in the high-dielectric-constant insulator are recovered by supplying oxygen (O) and silicon (Si) thereto generated from a silicon oxide ($SiO_2$) film formed in contact with the high-dielectric-constant insulator. As a result, a quality of the high-dielectric-constant insulator can be improved, thereby improving performance and reliability of the semiconductor storage device.

Figure 1B:
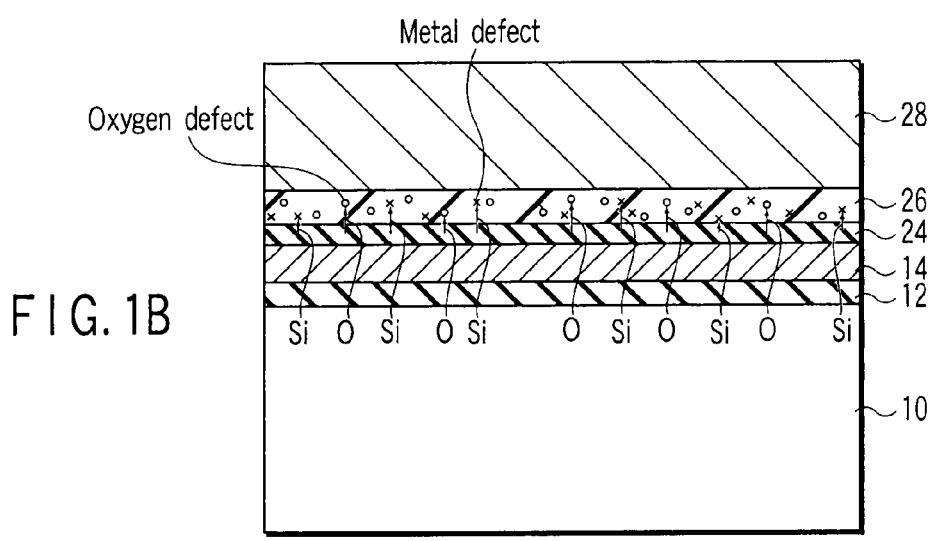
Figure 1C:
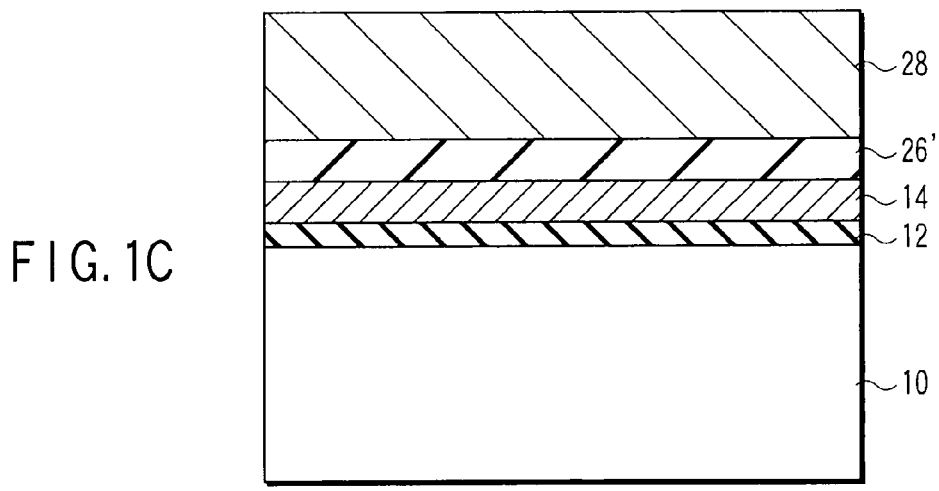

A description will be first given as to a principle according to an embodiment of the present invention with reference to schematic cross-sectional views of a semiconductor storage device according to the embodiment shown in FIGS. 1A to 1C.

In FIG. 1A, a cross-sectional view of a part of a semiconductor storage device is shown to focus on an inter-electrode insulator, in which, on a semiconductor substrate 10, e.g., a silicon substrate, a gate insulator 12, a first conductor layer 14, e.g., a floating gate electrode, an $SiO_2$ film 24, a high-dielectric-constant insulator 26, a second conductor layer 28, e.g., a control gate electrode are illustrated. In as deposited state, the high-dielectric-constant insulator 26 contains many oxygen defects (showed by ○ in FIG. 1A) and metal defects (showed by x), e.g., oxygen defects and hafnium defects in the case of a hafnium oxide ($HfO_2$) film, respectively. It is considered that these defects are generated due to an insufficient reaction of a metal element with oxygen since a formation temperature of the high-dielectric-constant insulator is not high enough, for example.

If a heat treatment is performed at a temperature of, e.g., 500° C. to 1200° C., in this state, then oxygen (O) and silicon (Si) are generated from the $SiO_2$ film 24 by a thermal decomposition of at least a part of the $SiO_2$ film 24, as shown in FIG. 1B. These oxygen and silicon diffuse into the high-dielectric-constant insulator 26 to respectively coupled with the oxygen defects (○) and the metal defects (x), as shown in FIG. 1B. Accordingly, the defects can be recovered, thereby forming a recovered high-dielectric-constant insulator 26' (FIG. 1C). It is to be noted that the $SiO_2$ film 24 can be completely decomposed as shown in FIG. 1C, but the film can be partially maintained.

Thus, the recovered high-dielectric-constant insulator 26' recovered from the defects inside can improve electrical characteristics, e.g., reducing a leak current.

An example of a manufacturing process of the non-volatile semiconductor storage device according to the embodiment of the present invention will now be described with reference to process cross-sectional views depicted in FIGS. 2A to 2G.

Figure 2A:
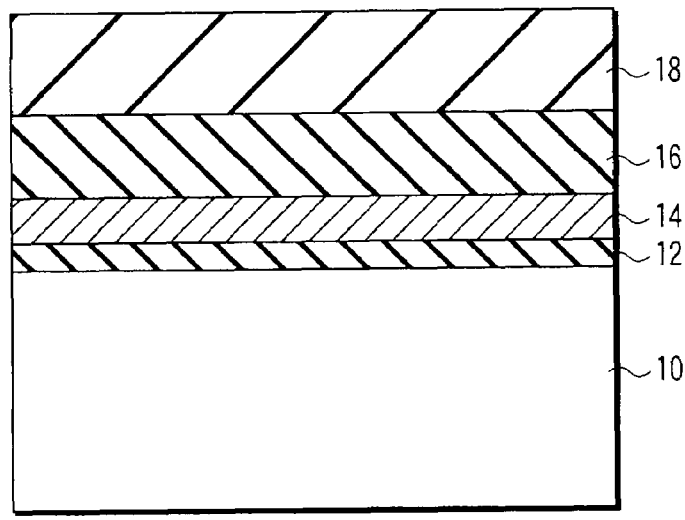
FIGS. 2A to 2G are process cross-sectional views illustrating manufacturing steps of the semiconductor storage device according to the embodiment of the present invention.

(1) First, as shown in FIG. 2A, a first insulator 12, a first conductor film 14, a second insulator 16 and a third insulator 18 are sequentially formed on a semiconductor substrate 10. As the semiconductor substrate 10, a p-type silicon substrate or an n-type silicon substrate having a p-well formed therein can be used. The first insulator 12 serves as a gate insulator, and for example, a $SiO_2$ film having a thickness of, e.g., 1 nm to 10 nm can be used. The first conductor film 14 is a film which is patterned to serve as a floating gate electrode of the non-volatile semiconductor storage device, and a polycrystal silicon film doped with phosphorous (P) having a thickness of 10 nm to 200 nm, for example, can be used for the first conductor film. The second and third insulators serve as masks when patterning isolation. For example, $Si_3N_4$ film having a thickness of, e.g., 50 nm to 200 nm can be used as the second insulator 16, and $SiO_2$ film having a thickness of, e.g., 50 nm to 400 nm can be used as the third insulator 18.

Figure 2B:
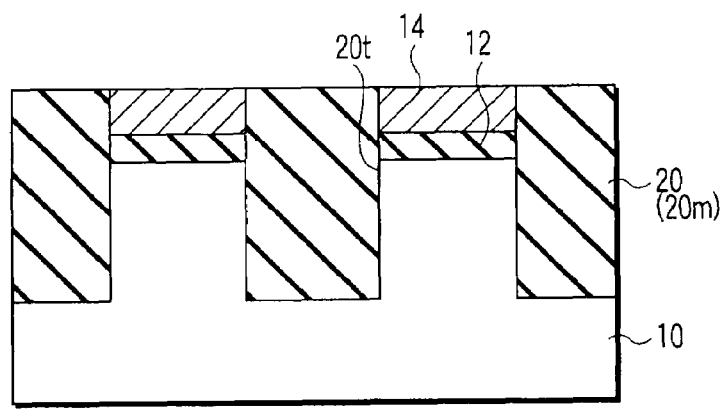

(2) Then, as shown in FIG. 2B, isolation 20 electrically isolating the first conductor film 14, the first insulator 12 and the silicon substrate 10 is being formed.

Specifically, the third insulator 18 is patterned by lithography and etching by removing the third insulator 18 in a region where isolation 20 is to be formed. Then, the second insulator 16 is etched with the third insulator 18 being used as a mask. The first conductor film 14, the first insulator 12 and the silicon substrate 10 are sequentially etched with the third insulator 18 and the second insulator 16 being used as masks, thereby forming isolation trench 20t. Then, the third insulator 18 and the second insulator 16 used as the masks are removed. Thereafter, thermal oxidation can be performed to recover an etching damage introduced in an inner wall of the isolation trench 20t, as required. Subsequently, a fourth insulator 20m is deposited on an entire surface to fill the isolation trench 20t. As the fourth insulator 20m, a $SiO_2$ film having a thickness of, e.g., 200 nm to 1500 nm, can be used. Thereafter, densification of the fourth insulator 20m can be carried out by a heat treatment at a high temperature. Then, chemical mechanical polishing (CMP) is effected using the first conductor film 14 as a stopper, and thus the fourth insulator 20m deposited above the first conductor film 14 is removed to planarize the surface. In this manner, the isolation 20 shown in FIG. 2B can be formed.

Figure 2C:
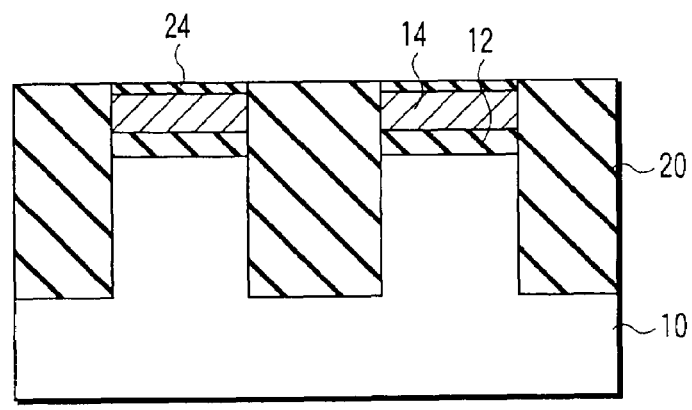

(3) Then, as shown in FIG. 2C, a fifth insulator 24 is formed on a surface of the first conductor film 14. The fifth insulator 24 is a thin silicon oxide ($SiO_2$) film 24 having a thickness of, e.g., 1.5 nm to 5 nm, more preferably, approximately 2 nm to 4 nm. Although it is preferable to form the fifth insulator 24 by a heat treatment in an atmosphere including an oxidizer, the film can be formed by any other method, e.g., chemical vapor deposition (CVD). When the fifth insulator 24 is formed by CVD, the fifth insulator 24 is formed with a uniform thickness not only on the first conductor film 14 but also on the isolation 20. When the fifth insulator 24 is formed by a heat treatment, an oxidizer, such as oxygen ($O_2$), ozone ($O_3$), nitrogen oxide (NO, $N_2O$, $NO_2$), radical oxygen (O), can be used. A processing temperature can be set to 300° C. to 1300° C., more preferably, 500° C. to 1200° C.

Figure 2D:
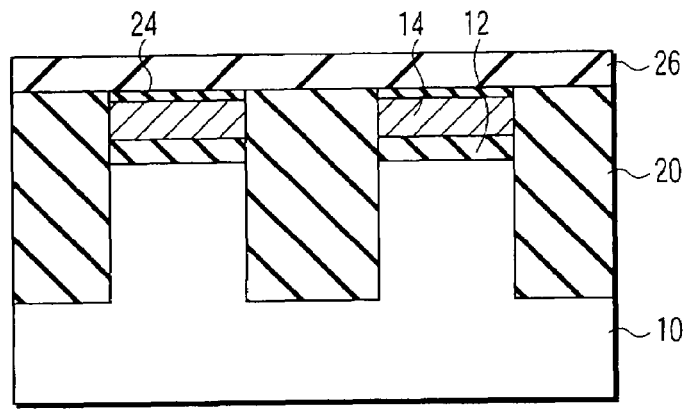

(4) Then, as shown in FIG. 2D, a sixth insulator 26 is formed on the entire surface. The sixth insulator 26 is an insulator having a relative dielectric constant larger than that of $SiO_2$ film. The sixth insulator 26 can be formed by not only a chemical deposition method like CVD but also a physical deposition method, e.g., physical vapor deposition (PVD). The sixth insulator 26 is an insulator having a relative dielectric constant larger than that of an ONO film (which relative dielectric constant is approximately five) which has been conventionally used as an inter-electrode insulator. For example, it is possible to use a single-layer film of an oxide or a nitride of, e.g., strontium (Sr), aluminum (Al), magnesium (Mg), scandium (Sc), gadolinium (Gd), yttrium (Y), samarium (Sm), hafnium (Hf), zirconium (Zr), tantalum (Ta), lanthanum (La), barium (Ba), bismuth (Bi) or the like, or a composite film in which some of these materials are laminated. Specifically, it is a strontium oxide (SrO) film having a relative dielectric constant of approximately six, an aluminum oxide ($Al_2O_3$) film having a relative dielectric constant of approximately eight, a magnesium oxide (MgO) film having a relative dielectric constant of approximately 10, a scandium oxide ($Sc_2O_3$) film or a gadolinium oxide ($Gd_2O_3$) film having a relative dielectric constant of approximately 14, a yttrium oxide ($y_2O_3$) film or a samarium oxide ($Sm_2O_3$) film having a relative dielectric constant of approximately 16, a hafnium oxide ($HfO_2$) film or a zirconium oxide ($ZrO_2$) film having a relative dielectric constant of approximately 22, a tantalum oxide ($Ta_2O_5$) film or a lanthanum oxide ($La_2O_3$) film having a relative dielectric constant of approximately 25, a barium oxide (BaO) film having a relative dielectric constant of approximately 35, a bismuth oxide ($Bi_2O_3$) film having a relative dielectric constant of approximately 40, or the like. Alternatively, a composite film including one or more of the above-described film and $SiO_2$ film and/or $Si_3N_4$ film (a relative dielectric constant: approximately seven) can be used. In case of the composite film, a laminated film having three or more layers can be used, but it is desirable that a relative dielectric constant of the overall film is greater than 5.0. Moreover, a ternary compound insulator, such as an oxide or a nitride containing any two metal elements constituting the above-described oxides or nitrides, e.g., hafnium aluminate (HfAlO), can be used.

During formation of an oxide film as the sixth insulator 26, oxygen defects and/or metal defects can be generated by an insufficient reaction or the like. Additionally, when an organic metal is used as a source of a metal, carbon (C) may be incorporated in the sixth insulator 26 at an amount of approximately $1 \times 10^{19}/cm^3$, for example. Such defects or an impurity like carbon deteriorate reliability of the sixth insulator 26.

Figure 2E:
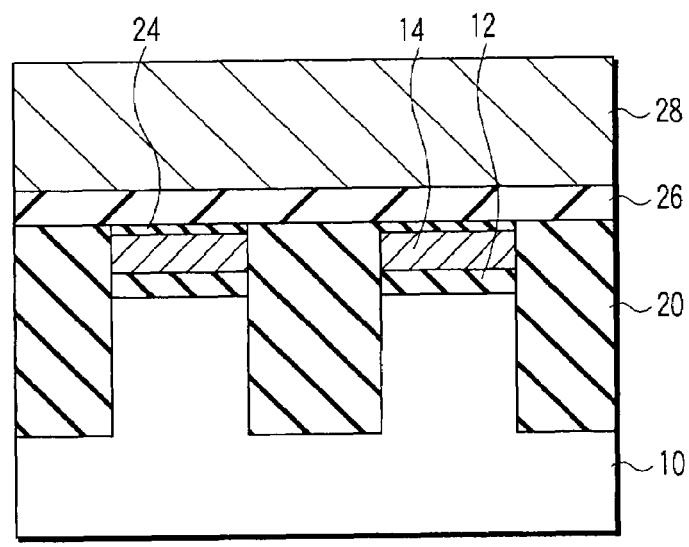

(5) Then, as shown in FIG. 2E, a second conductor film 28 is formed on the sixth insulator 26. The second conductor film 28 is a film which is patterned to serve as a control gate electrode of the non-volatile semiconductor storage device, and a polycrystal silicon film doped with a dopant at a high concentration and having a thickness of, e.g., 10 nm to 200 nm, can be used for the second conductor film. The second conductor film 28 can be formed by low pressure-CVD (LP-CVD) using silane as a source of silicon, for example. In the LP-CVD, since a reducing atmosphere is formed, a surface of the sixth insulator 26 is reduced and oxygen defects are further generated in the vicinity of the film surface if the sixth insulator 26 contains a metal oxide.

(6) Then, a heat treatment is carried out to densify the sixth insulator 26. The heat treatment is conducted at a temperature of, e.g., 500° C. to 1200° C. By this heat treatment, the sixth insulator 26 is densified and, at the same time, a reaction occurs at an interface between the fifth insulator 24 and the sixth insulator 26. The reaction generates oxygen by decomposing the fifth insulator 24 or by another mechanism, and the oxygen diffuses into the sixth insulator 26. The diffused oxygen is coupled with oxygen defects in the sixth insulator 26 to recover the sixth insulator 26.

Simultaneously, silicon is also generated from the fifth insulator 24 and diffuses into the sixth insulator 26. In addition, if the sixth insulator 26 and the second conductor film 28 are directly in contact with each other, then silicon is also generated and diffuses into the sixth insulator 26 from an interface between these films.

Figure 4:
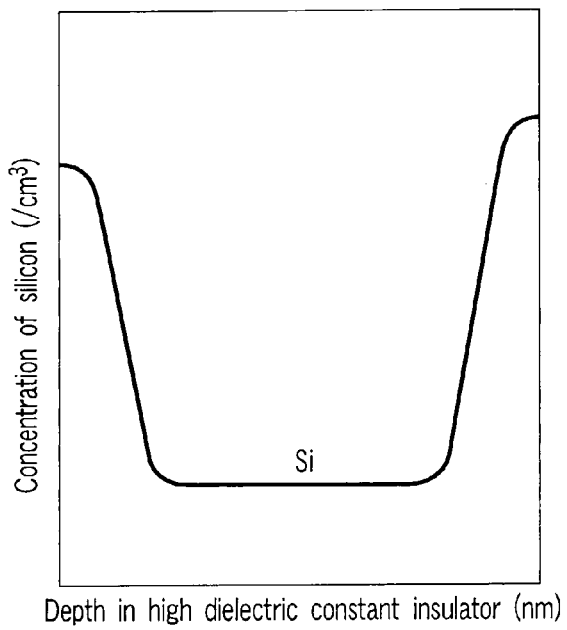
FIG. 4 is a view showing a diffused silicon concentration profile in a thickness direction of a high-dielectric-constant insulator according to the embodiment of the present invention.

The diffused silicon are not uniformly distributed in the sixth insulator 26 as shown in FIG. 4, but it is accumulated at a high concentration in the vicinity of an interface between the sixth insulator 26 and the fifth insulator 24 and an interface between the sixth insulator 26 and the second conductor 28, and the concentration is gradually lowered as apart from each interface. A maximum silicon concentration in the sixth insulator 26 is approximately 30 atomic % in the vicinity of both interfaces.

Figure 2F:
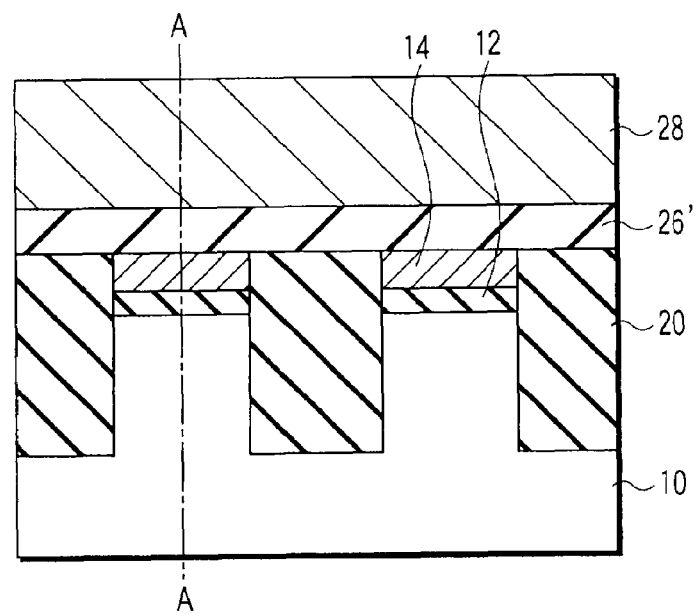

Oxygen and silicon are diffused by this heat treatment so that the sixth insulator 26 is brought into a recovered sixth insulator 26' recovered from defects as shown in FIG. 2F. The fifth insulator 24 is completely decomposed and consumed by the above-described heat treatment as shown in FIG. 2F. Alternatively, the fifth insulator 24 is not completely decomposed so that a part of it remains in some cases.

Figure 3:
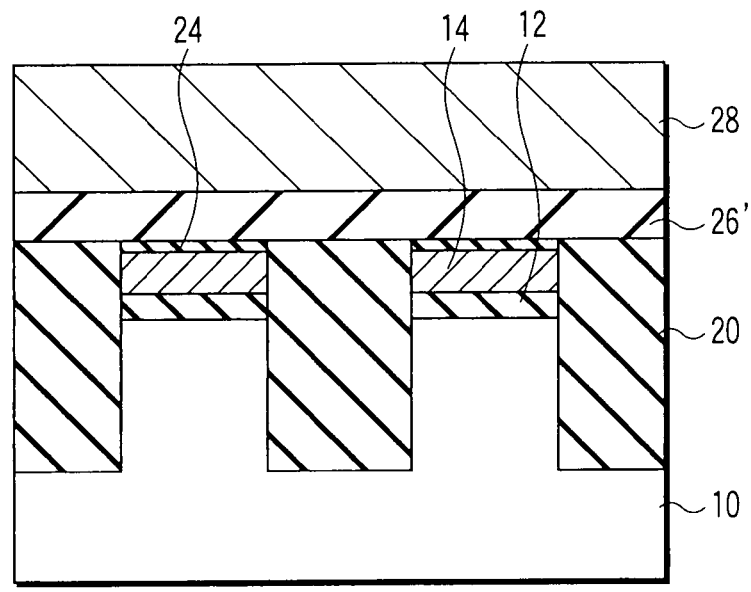
FIG. 3 is a cross-sectional view of a semiconductor storage device according to another embodiment of the present invention.

FIG. 3 shows an example where a part of the fifth insulator 24 remains. FIG. 3 is a cross-sectional view showing a semiconductor storage device according to another embodiment of the present invention. As shown in the drawing, in the semiconductor storage device, a part of a fifth insulator 24 remains between a first conductor film 14 and a sixth insulator 26.

As described above, when the fifth insulator 24 is formed by CVD, the fifth insulator 24 uniformly remains not only on the first conductor film 14 but also on the isolation 20. An effect of the defect recovery in the sixth insulator 26 is substantially the same either in a case where the fifth insulator 24 partially remains or a case where the fifth insulator 24 is completely decomposed.

(7) Then, a control gate electrode 28 is formed.

Figure 2G:
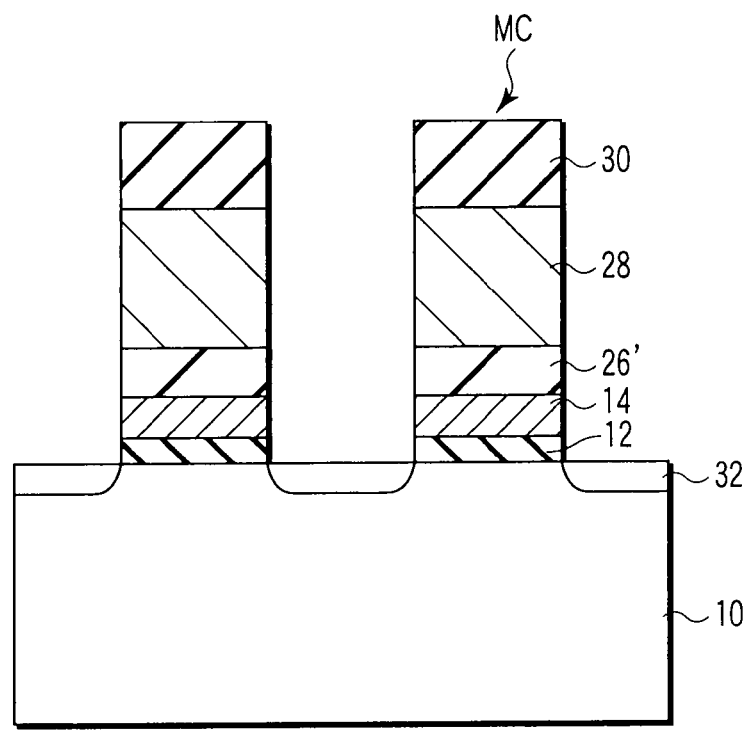

FIG. 2G is a cross-sectional view which is taken along a cutting-plane line A-A shown in FIG. 2F and is normal to a page surface.

Referring to FIG. 2G, a seventh insulator 30 is formed on the second conductor film 28. The seventh insulator 30 is patterned to a pattern of a control gate electrode 28 by lithography and etching. The second conductor film 28, the recovered sixth insulator 26', the first conductor film 14 and the first insulator 12 are sequentially etched with the seventh insulator 30 being used as a mask, thereby forming the control gate electrode 28 consisting of the second conductor film. The first conductor film 14 is divided into each piece to correspond to each memory cell, thus forming the floating gate electrode 14.

Then, a dopant is doped into the silicon substrate 10 with the control gate electrode 28 being used as a mask. For example, arsenic (As) is ion-implanted. As a result, a diffusion layer 32 is formed. The diffusion layer 32 electrically connects each memory cell MC in a direction orthogonal to the control gate electrode 28.

In this manner, the structure of the memory cell MC shown in FIG. 2G is brought to completion.

Then, a process required for the semiconductor storage device, e.g., a multilevel wiring process is carried out to complete the semiconductor storage device using the high-dielectric-constant insulator according to the embodiment.

Figure 5A:
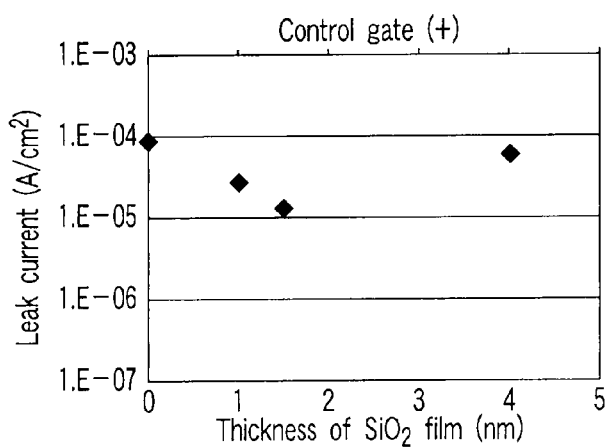
FIGS. 5A and 5B show leak current characteristics of the high-dielectric-constant insulator illustrating effects of the embodiment of the present invention.
Figure 5B:
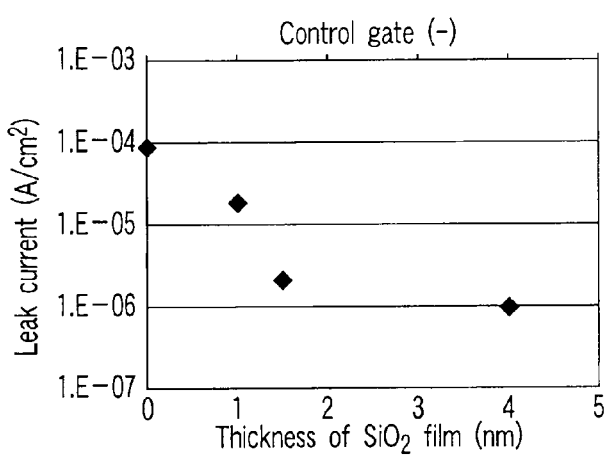

FIGS. 5A and 5B show examples of leak current characteristics of the high-dielectric-constant insulator (the sixth insulator) 26 of the thus manufactured semiconductor storage device. A horizontal axis in each drawing represents an original film thickness of the $SiO_2$ film (the fifth insulator) 24 formed on the floating gate electrode 14, and a vertical axis represents a leak current of the high-dielectric-constant insulator. FIG. 5A shows a case where a positive voltage is applied to the control gate electrode 28, and FIG. 5B illustrates a case where a negative voltage is applied to the same.

In both cases, a leak current of the high-dielectric-constant insulator 26 can be reduced by forming the $SiO_2$ film 24 on the floating gate electrode 14 irrespective of a polarity of the applied voltage. However, in the case where a positive voltage is applied to the control gate electrode 28, there is a tendency in which the leak current is increased if the $SiO_2$ film 24 is thicker than 4 nm. Therefore, it is preferable for a film thickness of the $SiO_2$ film 24 to be 4 nm or less. Further, although a result is not shown, a greater leak current reduction effect of the high-dielectric-constant insulator 26 can be obtained in a case where the $SiO_2$ film 24 is completely decomposed than a case where the $SiO_2$ film 24 is partly remained, if the $SiO_2$ film 24 in both cases has the same thickness originally.

As described above, supplying oxygen and silicon from the $SiO_2$ film to the high-dielectric-constant insulator can reduce the leak current of the high-dielectric-constant insulator. It can be considered that the leak current reduction is caused because the defects in the high-dielectric-constant insulator are recovered by oxygen and silicon supplied from the $SiO_2$ film.

The present invention is not limited to the foregoing embodiments, and can be modified in many ways. In one modification, the fifth insulator 24 can be formed by CVD in place of thermal oxidation. In CVD, the fifth insulator (the $SiO_2$ film) 24 can be formed by, e.g., a method which uses dichlorosilane as a source of silicon and $N_2O$ as an oxidizer or a method which uses tetraethoxysilane (TEOS) and ozone ($O_3$).

In another modification, a position at which the fifth insulator 24 is formed can be changed. For example, the fifth insulator 24 can be formed between the sixth insulator (the high-dielectric-constant insulator) 26 and the second conductor film (the control gate electrode) 28, the fifth insulator 24 can be formed above and below the sixth insulator 26, or it can be formed to be held in the sixth insulator 26. Even if the fifth insulator 24 is formed at such positions, oxygen and silicon can be generated from the fifth insulator 24 to be supplied into the sixth insulator 26 during the densification heat treatment of the sixth insulator 26 like the foregoing embodiments.

In still another modification, the densification heat treatment of the sixth insulator 26 can be performed after forming the sixth insulator 26 and before forming the second conductor 28.

The heat treatment can be carried out at a temperature of, e.g., 500° C. to 1200° C., in an inert gas atmosphere, e.g., argon (Ar), helium (He) or neon (Ne), or an oxidizing atmosphere, e.g., oxygen ($O_2$) or ozone ($O_3$).

In yet another modification, the fifth insulator 24 formed on the first conductor film 14 can be constituted as a laminated film including $Si_3N_4$ film and $SiO_2$ film. In this laminated film, the $SiO_2$ film is formed to be in contact with the sixth insulator 26. Even if the sixth insulator 26 is densified in an oxidizing atmosphere, the $Si_3N_4$ film can prevent formation of an undesired $SiO_2$ film on the first conductor film 14 due to diffusion of oxygen to the first conductor film 14 during the densification.

As described above, the present invention can recover various defects in the high-dielectric-constant insulator and improve characteristics such as current leak of the high-dielectric-constant insulator. Accordingly, a memory cell having a flat configuration can be achieved, whereby a wiring line delay due to capacitance coupling between memory cells can be reduced. Therefore, according to the present invention, the non-volatile semiconductor storage device using the high-dielectric-constant insulator having a structure suitable for miniaturization can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor storage device, comprising:
    depositing a first conductor layer on a semiconductor substrate through a first insulator;
    patterning the first conductor layer, the first insulator and the semiconductor substrate to form an isolation extending in a first direction;
    forming a silicon oxide film on the first conductor layer;
    depositing a high-dielectric-constant insulator on the silicon oxide film;
    depositing a second conductor film on the high-dielectric-constant insulator;
    recovering defects in the high-dielectric-constant insulator by decomposing the silicon oxide film and supplying oxygen and/or silicon to the high-dielectric-constant insulator by a heat treatment; and
    patterning the second conductor layer and the high-dielectric-constant insulator to be extended in a second direction orthogonal to the first direction to form a memory cell.

2. The manufacturing method of a semiconductor storage device according to claim 1, wherein the silicon oxide film has a film thickness of 1.5 nm to 4 nm.

3. The manufacturing method of a semiconductor storage device according to claim 1, wherein a relative dielectric constant of the high-dielectric-constant insulator is 5 or greater.

4. The manufacturing method of a semiconductor storage device according to claim 3, wherein the high-dielectric-constant insulator is a laminated film consisting of a plurality of insulators including an insulator whose relative dielectric constant is 5 or greater.

5. The manufacturing method of a semiconductor storage device according to claim 1, wherein the heat treatment for the recovering is performed at a temperature of 500° C. to 1200° C.

6. The manufacturing method of a semiconductor storage device according to claim 1, wherein the recovering is carried out between the depositing the high-dielectric-constant insulator and the depositing the second conductor layer.

7. The manufacturing method of a semiconductor storage device according to claim 1, wherein the silicon oxide film is completely decomposed during the recovering.

8. The manufacturing method of a semiconductor storage device according to claim 7, wherein the silicon oxide film has a film thickness of 1.5 nm to 4 nm.

9. The manufacturing method of a semiconductor storage device according to claim 7, wherein a relative dielectric constant of the high-dielectric-constant insulator is 5 or greater.

10. The manufacturing method of a semiconductor storage device according to claim 9, wherein the insulator is a laminated film consisting high-dielectric-constant of a plurality of insulators including an insulator whose relative dielectric constant is 5 or greater.

11. The manufacturing method of a semiconductor storage device according to claim 7, wherein the high-dielectric-constant insulator contains at least aluminum or hafnium.

12. The manufacturing method of a semiconductor storage device according to claim 11, wherein the high-dielectric-constant insulator contains at least an oxide or a nitride of aluminum, hafnium or zirconium.

13. The manufacturing method of a semiconductor storage device according to claim 7, wherein the heat treatment for the recovering is performed at a temperature of 500° C. to 1200° C.

14. The manufacturing method of a semiconductor storage device according to claim 7, wherein the recovering is carried out between the depositing the high-dielectric-constant insulator and the depositing the second conductor layer.

* * * * *